US006504933B1

(12) United States Patent
Chung

(10) Patent No.: US 6,504,933 B1
(45) Date of Patent: Jan. 7, 2003

(54) THREE-DIMENSIONAL SOUND SYSTEM AND METHOD USING HEAD RELATED TRANSFER FUNCTION

(75) Inventor: Dong-Ook Chung, Seongnam (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/195,591

(22) Filed: Nov. 18, 1998

(30) Foreign Application Priority Data

Nov. 21, 1997 (KR) ........................................ 97-61688

(51) Int. Cl.[7] ........................ H04R 5/00; H04R 5/02; H03G 3/00

(52) U.S. Cl. ......................... 381/1; 381/61; 381/307

(58) Field of Search ........................... 381/1, 17, 61, 381/307

(56) References Cited

U.S. PATENT DOCUMENTS 4,748,669 A 5/1988 Klayman ..................... 381/1
5,438,623 A * 8/1995 Begault ..................... 381/17
5,930,733 A * 7/1999 Park et al. ................... 381/1
5,970,153 A * 10/1999 Petroff ...................... 381/17
6,067,361 A * 5/2000 Kohut et al. ................. 381/17

* cited by examiner

*Primary Examiner*—Forester W. Isen
*Assistant Examiner*—Laura A. Grier
(74) *Attorney, Agent, or Firm*—Mills & Onello LLP

(57) ABSTRACT

A three-dimensional sound system and a method utilizing a head related transfer function (HRTF) for providing a three-dimensional sound effect from a two-channel stereo signal source having first and second signals are disclosed. The system includes a first high-pass filter for removing a direct current (DC) component from the first signal and a second high pass filter for removing a direct current (DC) component from the second signal. The system includes a first FIR filter having a modified head related transfer function (HRTF) $M1(e^{jw})$ for re-localizing a first position of a sound source of the first signal input to the first high-pass filter to a second position. The system also includes a second FIR filter having a modified HRTF $M2(e^{jw})$ for re-localizing a third position of a sound source of the second signal input to the second high-pass filter to a fourth position. A first gain controller controls gain from an output signal from the first FIR filter, and a second gain controller controls gain from an output signal from the second FIR filter.

15 Claims, 5 Drawing Sheets

THREE-DIMENSIONAL SOUND SYSTEM AND METHOD USING HEAD RELATED TRANSFER FUNCTION

BACKGROUND OF THE INVENTION (a) Field of the Invention

The present invention relates to a three-dimensional 3-D sound system and a method thereof, and more particularly to a system and a method utilizing a head related transfer function (HRTF) for processing a two-channel signal to provide a 3-D sound effect.

(b) Description of the Related Art

A goal of a 3-D sound system is not only to reproduce the localization of the original sound sources but also to control the listener's spatial auditory perception. To accomplish this, it is generally more effective to use 3-D sound technology in the recording (or encoding) process than in the reproducing (or decoding) process.

There has been significant study and research into implementing 3-D sound technology in recording, but the technology has not yet been applied to real recording systems. Two-channel stereo sound technology is still widely used in most recording systems to reproduce the sound source in audio, video, TV, etc.

On the other hand, some systems, including commercial theater and home theater sound systems, employ multi-channel reproducing methods (for example, Dolby, pro-logic, AC-3) to produce a 3-D sound effect. Generally, the multi-channel reproducing method mixes two-channel stereo signals with surround signals for a 3-D sound effect.

However, there is a drawback in such systems in that the use of the multi-channel reproducing method is limited to few recording systems, and there is a high cost associated with its implementation. As a result, many commercial sound systems are developed to implement a 3-D sound effect from two-channel stereo sources with two ordinary speakers. A prevailing method used in these systems is a stereo enhancement method.

An example of such a stereo enhancement method is described in U.S. Pat. No. 4,748,669. According to the stereo enhancement method, a sum signal (L+R) and a difference signal (L−R or R−L) are obtained from a stereo signal comprised of a left-channel signal (L-signal) and a right-channel signal (R-signal). The difference signal is dynamically enhanced to make the sound more spacious and deeper. That is to say, the stereo enhancement method analyzes the difference signal for each frequency band; and, if the magnitude is determined to be relatively small, the magnitude of the difference signal is increased and the magnitude of the sum signal is decreased, thereby realizing a sound with more depth and space.

However, the stereo enhancement method has many disadvantages. According to the method, the direction of the original sound source is distorted because it processes mixed signals, that is, both the sum and difference signals. Furthermore, processing mixed signals creates a mono-signal component which R and L-channels have in common, thereby creating a sound at the center of a listener. Therefore, when the channels of the original sound signal are widely separated, the resulting sound image is rather narrower than the original sound.

Further, an original sound signal which has been processed in many steps reproduces as an unnatural sound, which makes it difficult for an audience to listen for long periods of time.

SUMMARY OF THE INVENTION

In view of the foregoing, it is an object of the present invention to reproduce 3-D sound from a 2-channel stereo signal using a head related transfer function (HRTF).

It is another object of the present invention to maintain the direction of the original sound by processing signals for each channel separately.

According to one aspect of the present invention, to accomplish the above and other objects, each signal of 2-channel stereo signal is input to high-pass filter to remove the direct-current (DC) component. Each signal with removed DC component is processed by a finite impulse response (FIR) filter to produce a 3-D sound effect. The FIR filter implements the magnitude characteristic of the HRTF for a location adjustment. The FIR filters each receive an output signal from a high-pass filter and utilize a modified head related transfer function to relocalize a first position of a sound source to a second position, wherein the first position is an original position of the sound source and the second position is a target position of the sound source. Gain controllers are used to control gain of the signals output from the FIR filters.

In another aspect, a low-frequency compensation filter is used to compensate a low-frequency region of the output signals from the high-pass filters. A first adder is used to add output signals from the low-frequency compensation filter to the output of one of the FIR filters. A second adder adds output signals from the low-frequency compensation filter to the other FIR filter. Gain controllers control gain of output signals from the first and second adders.

In one embodiment, the two signals of the two-channel signal source correspond to left and right sides of a stereo signal. In one embodiment, the low-frequency compensation filter individually filters outputs from the high-pass filters. In another embodiment, the low-frequency compensation filter filters added outputs from the high-pass filters.

The HRTF is a spatial-filtering of a sound signal before it reaches the ear drum. Due to the asymmetry in the shape of the pinnae, when a single sound source is duplicated at a different position, a listener can recognize the position of each sound source because each sound source has a different HRTF.

According to another aspect of the present invention, a HRTF is properly modified and the modified HRTF is applied to a sound source such that a listener can recognize the predetermined location of the sound source, irrespective of its real location.

According to yet another aspect of the present invention, each signal with its DC component removed by a high-pass filter is applied to a low frequency compensation filter as well as to a FIR filter. At this time, the low frequency compensation filter compensates a low-frequency component lost during microphone recording, to maintain the direction of the recorded voice.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

The present invention now will be described more fully hereinafter with reference the accompanying drawings, in which embodiments of the invention are shown. This invention may, however, be embodied in many different forms and should not be construed as limited to the embodiments set forth herein; rather these embodiments are provided so that this disclosure will be thorough and complete, and will fully convey the scope of the invention to those skilled in the art.

Figure 1:
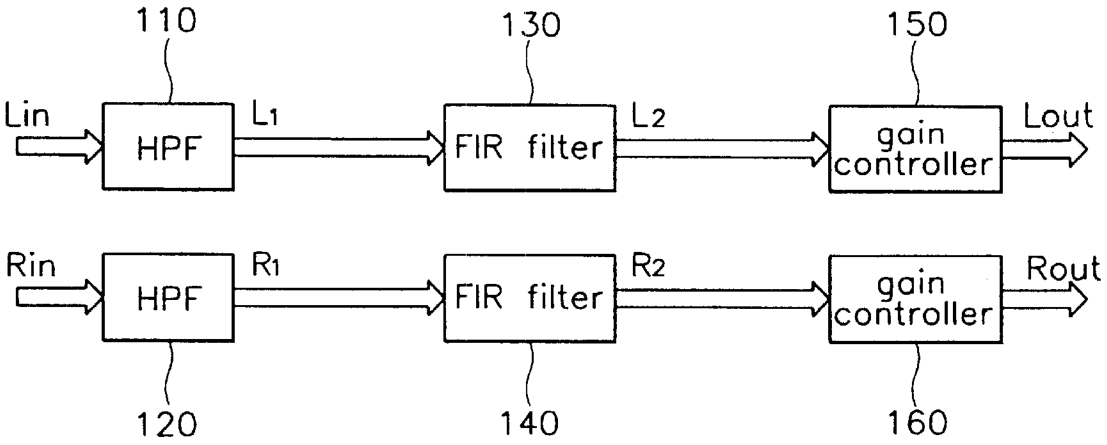
FIG. 1 is a block diagram showing a 3-D sound system according to a first embodiment of the present invention.

FIG. 1 shows a 3-D block diagram of a sound system in accordance with a first embodiment of the present invention. The 3-D sound system of FIG. 1 comprises high-pass filters HPF 110 and 120, FIR filters 130 an 140, and gain controllers 150 and 160.

As shown by FIG. 1, the HPFs 110 and 120 receive two-channel input signals, a left input signal Lin and a right input signal Rin. Each HPF 110 and 120 removes the DC signal component having almost a zero-frequency level and outputs signals L1 and R1, respectively. The signals L1 and R1 are input to the FIR filters 130 and 140 which filter the signals according to modified HRTFs $M1(e^{jw})$ and $M2(e^{jw})$, respectively, in accordance with the invention. As described above, since the FIR filters 130 and 140 filter signals L1 and L2 according to the modified HRTFs $M1(e^{jw})$ and $M2(e^{jw})$ and outputs signals L2 and R2, respectively, a listener hears a sound with a different spatial arrangement from the location of the original sound source. The gain controllers 150 and 160 receive the signals L2 and R2, respectively, and output signals L(out) and R(out), respectively, at a desired gain level.

Next, a modified HRTF according to the present invention will be described in detail. A modified HRTF is a mathematical function which rearranges the location of the sound source. If a listener's HRTFs are $A(e^{jw})$ and $B(e^{jw})$ for any sound source location at position X and at Y, respectively, a modified HRTF $M(e^{jw})$ is obtained according to the following equation (1). (Here, $A(e^{jw})$ and $B(e^{jw})$ are obtained from an experiment).

$$M(e^{jw})=B(e^{jw})/A(e^{jw}) \quad (1)$$

The location of the sound source at position X can be changed to position Y by filtering the source signal with a modified HRTF $M(e^{jw})$. That is, by multiplying HRTF $A(e^{jw})$ corresponding to sound source position X by modified HRTF $M(e^{jw})$, a different sound source position Y corresponding to HRTF $B(e^{jw})$ can be obtained for the original sound source, and the listener will perceive the sound as if it had originated from the position Y.

However, since the characteristics of magnitude and phase of HRTF are rather complex, modified HRTFs cannot be easily implemented. Accordingly, in order to more effectively and efficiently implement modified HRTFs, in one embodiment, the present invention utilizes only the magnitude of HRTFs as opposed to utilizing both the magnitude and phase characteristics, since the magnitude of the HRTF is more significant and critical for localizing the position of the sound source.

Figure 2A:
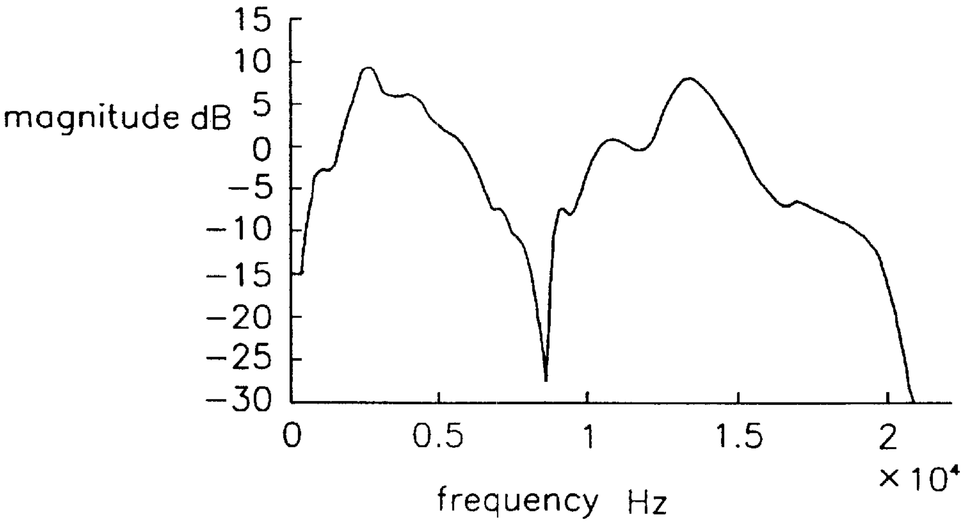
FIGS. 2*a* and 2*b* are graphs showing magnitudes of HRTFs when sound sources are at a front location (0°) and at a side location (90°), respectively.
Figure 2B:
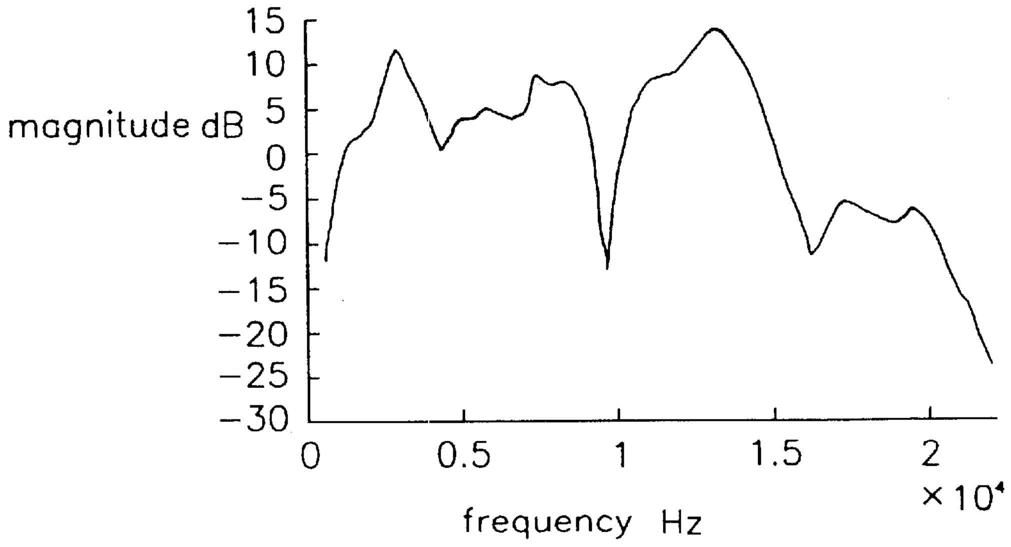
Figure 2C:
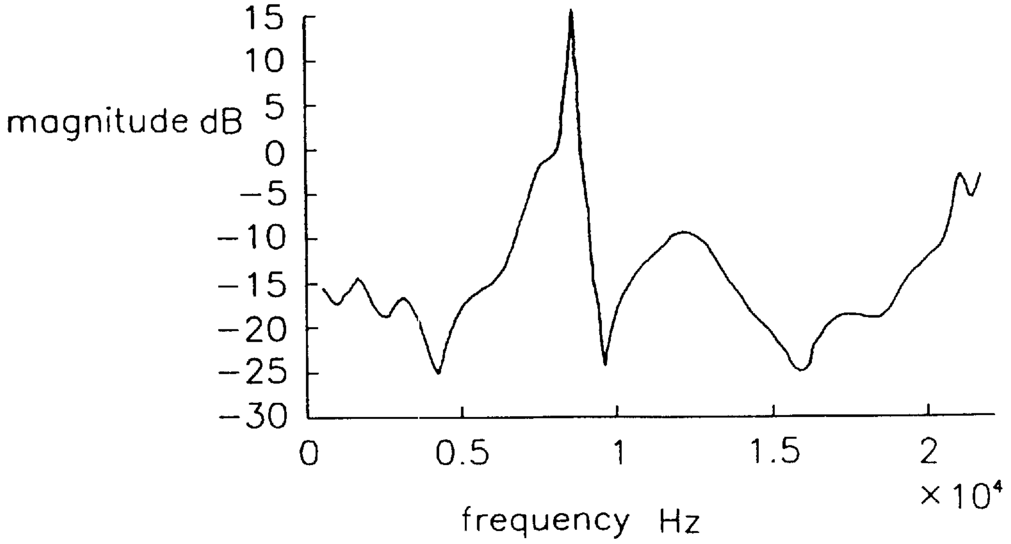
FIG. 2*c* is a graph showing a result of dividing the magnitude of FIG. 2*b* by the magnitude of FIG. 2*a*.

Each of FIGS. 2*a*, 2*b*, and 2*c* illustrates an example of magnitude characteristics of a HRTF. The Y-axis and X-axis of the graphs illustrated in the figures indicate magnitude and frequency of the HRTF, respectively. FIG. 2*a* shows the HRTF's magnitude $|A(e^{jw})|$ when a speaker or a sound source is located in front of a listener, and FIG. 2*b* shows the HRTF's magnitude $|B(e^{jw})|$ when the sound source is located 90° from the front. Accordingly, in order to relocate the sound source located at the front to the side of the listener, $|A(e^{jw})|$ is adjusted by the modified magnitude of HRTF $|M(e^{jw})|$, where $|M(e^{jw})|$ is defined by $|B(e^{jw})|/|A(e^{jw})|$, and its magnitude is shown in FIG. 2*c*. In one preferred embodiment of the present invention, the magnitude characteristic of the modified HRTF $M(e^{jw})$ is embodied in a FIR filter.

Figure 3A:
FIGS. 3*a* to 3*d* are graphs showing step processed magnitudes of HRTFs by a FIR filter.

FIGS. 3*a* to 3*d* are graphs showing step processed magnitudes of HRTFs by the FIR filter. First, as shown in FIG. 3*a*, the magnitude $|M(e^{jw})|$ of modified HRTF $M(e^{jw})$ is obtained. This magnitude, as previously described, is obtained by dividing the magnitude of the HRTF corresponding to a new designated location by the magnitude of the HRTF corresponding to the location of the original sound source.

Figure 3B:
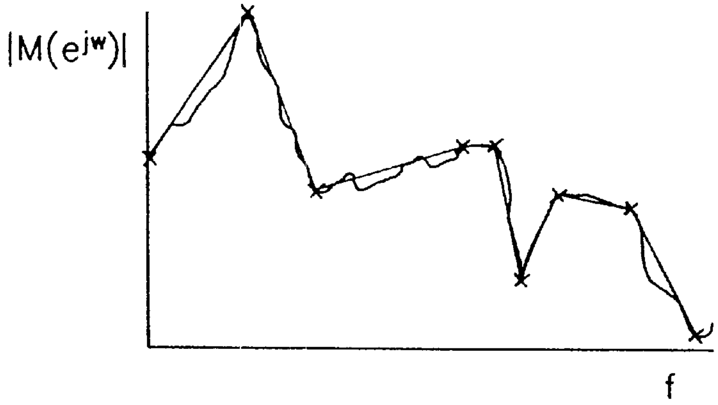
Figure 3C:
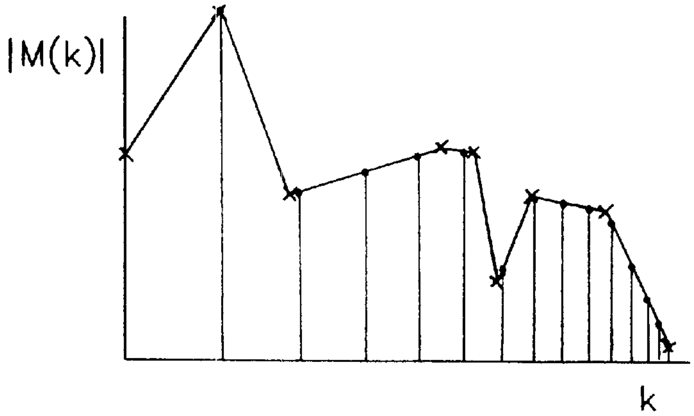

Next, as shown in FIG. 3*b*, peaks and troughs, i.e., local maxima and minima, which characterize the magnitude of $|M(e^{jw})|$, are obtained. Next, as shown in FIG. 3*c*, the peaks and troughs are interpolated and sampled at intervals of (k=1,2, . . . , N) to obtain a number n of |M(k)| samples. In one embodiment, the interpolation is performed in log scale frequency with regard to a human psychoacoustic model.

Figure 3D:
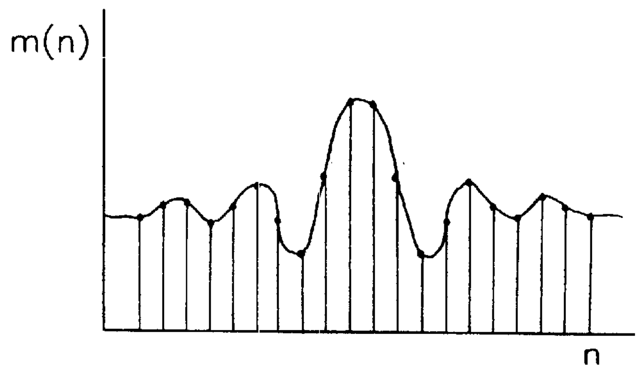

As shown in FIG. 3*d*, filter coefficients of FIR filters are then obtained by a frequency sampling method. At this time, the filtered coefficients are characterized by having linear phase.

In a preferred embodiment, filter coefficients of FIR are obtained according to the following equation (2).

$$m(n) = \frac{1}{N}\left\{\sum_{k=1}^{N/2-1} 2|M(k)|\cos|[2\pi k(n-a)/N]| + M(0)\right\}, \quad (2)$$

whereα=(N 1)/2 and N is even.

As described above, according to the first embodiment of the present invention, signals L1 and R1, with DC components removed, are filtered by modified HRTF $M1(e^{jw})$ and $M2(e^{jw})$, respectively, to have the location of its respective original sound source re-localized to different positions to change the left and right spatial cue of a listener.

Figure 4:
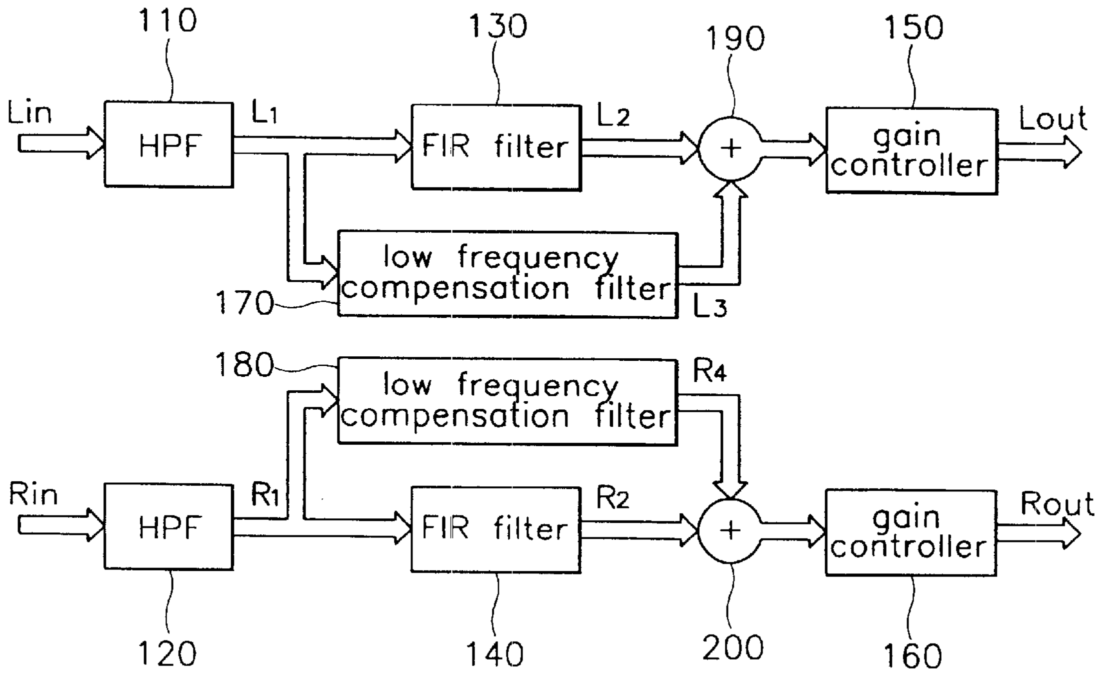
FIG. 4 is a block diagram showing a 3-D sound system according to a second embodiment of the present invention.

FIG. 4 is a block diagram showing a 3-D sound system according to a second embodiment of the present invention. As shown in FIG. 4, the second embodiment of the present invention comprises high-pass filters 110 and 120, FIR filters 130 and 140, gain controllers 150 and 160, low-frequency compensation filters 170 and 180, and adders 190 and 200. Since the functions of the high-pass filters 110 and 120, FIR filters 130 and 140, and gain controllers 150 and 160 are analogous to their functions in the first embodiment described above, a further explanation of their functions will not be provided.

As illustrated in FIG. 4, signals L1 and R1 are input to low-frequency compensation filters 170 and 180, respectively, as well as to FIR filters 130 and 140, respectively. The low-frequency compensation filters 170 and 180 are used for compensating lost low-frequency regions as described below.

HRTF data is mainly obtained by using a probe microphone. But its frequency response tapers off at frequencies below 2.5 kHz. The low frequency compensation filters 170 and 180 compensate the lost low-frequency data by enhancing the lower frequency region of signals L1 an R1.

Further, the low-frequency compensation filters 170 and 180 also serve to help maintain directions of voice or speech. Generally, voice or speech signals in channels are mono type signals w and have difficulty maintaining their directional sense for a listener while a surrounding sound source is being re-localized for achieving a 3-D sound effect in the embodiments of the present invention. Accordingly, it is desirable to maintain the direction of a voice or speech sound source, in order not to confuse the audience listening to conversation which is being processed for the 3-D effect.

In FIG. 4, output signals L2 and R2 from the FIR filters 130 and 140, respectively, are input to adders 190 and 200, respectively. The adder 190 adds the signal L2 with an output signal L3 from the low-frequency compensation filter 170, and the adder 200 adds the signal R2 with an output signal R3 from the low-frequency compensation filter 180. The adders 190 and 200 output the added signals to the gain controllers 150 and 160, respectively.

In FIG. 4, signals from two channels are separately input to the low-frequency compensation filters 170 and 180. Alternatively, two signals from two channels can be combined prior to being input to the low-frequency compensation filters, as shown in FIG. 5, which is a block diagram showing a 3-D sound system according to a third embodiment of the present invention.

Figure 5:
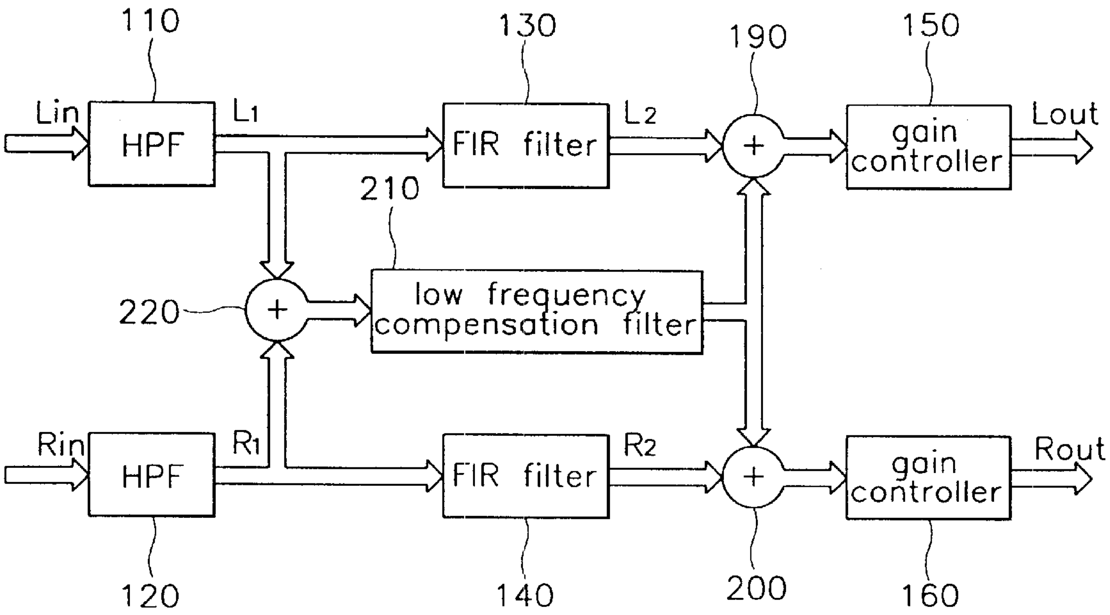
FIG. 5 is a block diagram showing a 3-D sound system according to a third embodiment of the present invention.

As shown in FIG. 5, the 3-D sound system according to the third embodiment of the present invention comprises high-pass filters 110 and 120, FIR filters 130 and 140, gain controllers 150 and 160, a low-frequency compensation filter 210, and adders 190, 200, and 220. Since the functions of the high-pass filters 110 and 120, FIR filters 130 and 140, gain controllers 150 and 160, the low-frequency compensation filter 210, and adders 190 and 200 are analogous to their functions in the first and second embodiments of the present invention, a further explanation of their functions will not be provided.

According to the third embodiment of the present invention, signals from two-channels L1 and R1, with DC components removed, are input to the adder 220. An added signal is output to the low-frequency compensation filter 210 to be compensated for lost frequencies in the low range. Compensated signals are then separated and input to their respective adders 190 and 200. The adder 190 adds a signal L2 from the FIR filter 130 with the compensated signal, and the adder 200 adds a signal R2 from the FIR filter 140 with the compensated signal output from the low-frequency compensated filter 210. Added signals from the adder 190 and 200 are output to the gain controllers 150 and 160, respectively.

According to the present invention, by implementing modified HRTF into FIR filters for independently processing two-channel signals, mono-sound components can be eliminated to achieve a relatively simple and efficient natural 3-D effect. Further, utilization of low-frequency compensation filters, which enhance the low-frequency region by compensating for lost low-frequency information, enables directional spatial perception of voice sound sources to be maintained while its surrounding sound sources are being re-localized for 3-D effect.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A three-dimensional sound system for providing a three-dimensional sound effect from a two-channel signal source having first and second signals comprising:

a first high-pass filter for removing a direct current (DC) component from the first signal;

a second high-pass filter for removing a DC component from the second signal;

a first FIR filter which receives an output signal from the first high-pass filter and utilizes a modified (HRTF) M1($e^{jw}$) for re-localizing a first position of a sound source to a second position, wherein the first position is an original position of the sound source and the second position is a target position of the sound source;

a second FIR filter which receives an output signal from the second high pass filter and utilizes a modified HRTF M2($e^{jw}$) for re-localizing a third position of a sound source to a fourth position, wherein the third position is an original position of the sound source and the fourth position is a target position of the sound source;

a first gain controller for controlling gain of an output signal from the first FIR filter; and a second gain controller for controlling gain of an output signal from the second FIR filter; wherein the modified HRTF M1($e^{jw}$) is obtained by dividing HRTF Y1($e^{jw}$) of the second position by HRTF X1($e^{jw}$) of the first position; and the modified HRTF M2($e^{jw}$) is obtained by dividing HRTF Y2($e^{jw}$) of the fourth position by HRTF X2($e^{jw}$) of the third position.

2. The three-dimensional sound system according to claim 1, wherein the first and second signals correspond to a left and a right side of a stereo signal, respectively.

3. The three-dimensional sound system according to claim 1, wherein the first and second FIR filters utilize magnitude characteristics of modified HRTF M1($e^{jw}$) and M2($e^{jw}$), respectively.

4. The three-dimensional sound system according to claim 1, wherein:

the first and second FIR filters each interpolate and sample magnitude characteristics of modified HRTF |M1($e^{jw}$)| corresponding to re-localizing the first position to the second position and |M2($e^{jw}$)| corresponding to re-localizing the third position to the second position, respectively, for obtaining a number n of respective magnitude |M1(k)| and |M2(k)| samples; and the first and second FIR filters obtain respective FIR filter coefficients having linear-phase characteristics from n magnitude |M1(k)| and |M2(k)| samples by a frequency sampling method.

5. A three-dimensional sound system for providing a three-dimensional sound effect from a two-channel signal source having first and second signals comprising:

a first high-pass filter for removing a direct current (DC) component from the first signal;

a second high-pass filter for removing a DC component from the second signal;

a first FIR filter which receives an output signal from the first high-pass filter and utilizes a modified head related transfer function (HRTF) M1($e^{jw}$) for re-localizing a first position of a sound source to a second position, wherein the first position is an original position of the sound source and the second position is a target position the sound source;

a second FIR filter which receives an output signal from the second high-pass filter and utilizes a modified HRTF $M2(e^{jw})$ for re-localizing a third position of a sound source to a fourth position, wherein the third position is an original position of the sound source and the fourth position is a target position of the sound source;

low-frequency compensation filter for compensating a low-frequency region of both output signals from the first and second high-pass filters;

a first adder for adding output signals from the low-frequency compensation filter and the first FIR filter;

a second adder for adding output signals from the low-frequency compensation filter and the second FIR filter;

a first gain controller for controlling gain of an output signal from the first adder; and a second gain controller for controlling gain of an output signal from the second adder; wherein the modified HRTF $M1(e^{jw})$ is obtained by dividing HRTF $Y1(e^{jw})$ of the second position by HRTF $X1(e^{jw})$ of the first position; and the modified HRTF $M2(e^{jw})$ is obtained by dividing HRTF $Y2(e^{jw})$ of the fourth position by HRTF $X2(e^{jw})$ of the third position.

6. The three-dimensional sound system according to claim 5, wherein the first and second signals correspond to a left and a right side of a stereo signal, respectively.

7. The three-dimensional sound system according to claim 5, wherein the low-frequency region indicated is below 2.5 KHz.

8. The three-dimensional sound system according to claim 5, wherein the low-frequency compensation filter individually filters outputs from the first and second high-pass filters.

9. The three-dimensional sound system according to claim 5, wherein the low frequency compensation filter filters added outputs from the first and second high-pass filters.

10. The three-dimensional sound system according to claim 5, wherein the first and second FIR filters utilize magnitude characteristics of modified HRTF $M1(e^{jw})$ and $M2(e^{jw})$, respectively.

11. The three-dimensional sound system according to claim 5, wherein:

the first and second FIR filters each interpolate and sample magnitude characteristics of modified HRTF $|M1(e^{jw})|$ corresponding to re-localizing the first position to the second position and $|M2(e^{jw})|$ corresponding to re-localizing the third position to the second position, respectively, for obtaining a number n of respective magnitude $|M1(k)|$ and $|M2(k)|$ samples; and the first and second FIR filters obtain respective FIR filter coefficients having linear-phase characteristics from n magnitude $|M1(k)|$ and $|M2(k)|$ samples by frequency sampling method.

12. A method for providing a three-dimensional sound effect from a two-channel signal source having first and second signals comprising the steps of:

removing direct current (DC) components from the first and second signals with high-pass filters;

filtering the first signal with removed DC components by a first modified head related transfer function for re-localizing a first position of a sound source to a second position;

filtering the second signal with removed DC components by a second modified head related transfer function for re-localizing a third position of a sound source to a fourth position; and controlling gains of signals filtered by the first and second modified head related transfer functions; wherein the first modified HRTF $M1(e^{jw})$ is obtained by dividing HRTF $Y1(e^{jw})$ of the second position by HRTF $X1(e^{jw})$ of the first position; and the second modified HRTF $M2(e^{jw})$ is obtained by dividing HRTF $Y2(e^{jw})$ of the fourth position by HRTF $X2(e^{jw})$ of the third position.

13. The method of providing a three-dimensional sound effect according to claim 12, wherein the first and second signals correspond to a left and a right side of a stereo signal, respectively.

14. The method of providing a three-dimensional sound effect according to claim further comprising the steps of:

filtering the first and second signals with removed DC components to compensate for information lost in low-frequency regions; and adding low-frequency compensated first and second signals with outputs from the first and second FIR filters, respectively.

15. The method of providing a three-dimensional sound effect according to claim 14, wherein the low-frequency region indicated is below 2.5 KHz.

* * * * *

UNITED STATES PATENT AND TRADEMARK OFFICE

CERTIFICATE OF CORRECTION

PATENT NO. : 6,504,933 B1

DATED : January 7, 2003

INVENTOR(S) : Dong-Ook Chung

It is certified that error appears in the above-identified patent and that said Letters Patent is hereby corrected as shown below:

Column 8,
Line 39, please insert -- 12, -- before "further".

Signed and Sealed this

Sixth Day of January, 2004

JAMES E. ROGAN

*Director of the United States Patent and Trademark Office*